United States Patent
Suzuki et al.

(10) Patent No.: US 10,177,138 B2
(45) Date of Patent: Jan. 8, 2019

(54) SEMICONDUCTOR DEVICE

(71) Applicants: KABUSHIKI KAISHA TOYOTA CHUO KENKYUSHO, Nagakute-shi, Aichi (JP); KABUSHIKI KAISHA TOKAI RIKA DENKI SEISAKUSHO, Niwa-gun, Aichi (JP)

(72) Inventors: Takashi Suzuki, Nagakute (JP); Narumasa Soejima, Nagakute (JP); Yosuke Kanie, Niwa-gun (JP); Kengo Shima, Niwa-gun (JP)

(73) Assignees: KABUSHIKI KAISHA TOYOTA CHUO KENKYUSHO, Nagakute-shi (JP); KABUSHIKI KAISHA TOKAI RIKA DENKI SEISAKUSHO, Niwa-gun (JP)

( * ) Notice: Subject to any disclaimer, the term of this patent is extended or adjusted under 35 U.S.C. 154(b) by 0 days.

(21) Appl. No.: 15/882,432

(22) Filed: Jan. 29, 2018

(65) Prior Publication Data
US 2018/0233497 A1    Aug. 16, 2018

(30) Foreign Application Priority Data
Feb. 13, 2017  (JP) .................. 2017-024147

(51) Int. Cl.
*H01L 29/74* (2006.01)
*H01L 29/72* (2006.01)
*H01L 27/02* (2006.01)

(52) U.S. Cl.
CPC ...... *H01L 27/0288* (2013.01); *H01L 27/0262* (2013.01)

(58) Field of Classification Search
CPC ................... H01L 27/0288; H01L 27/0262
USPC ........ 257/173, 107, 133, 355, 531, E27.023, 257/E27.052, E27.112, E23.141, E23.147, 257/E29.211, E29.216, E29.221, E29.225, 257/E21.022, E21.477, E21.597; 361/56, 361/111, 118; 438/133, 135, 157, 600
See application file for complete search history.

(56) References Cited

U.S. PATENT DOCUMENTS

| 6,249,414 B1* | 6/2001 | Lee ..................... H01L 27/0262 257/360 |
| 6,388,851 B1* | 5/2002 | Pettersson ............... H01L 23/60 257/355 |
| 2004/0027743 A1* | 2/2004 | Higashi ............... H01L 27/0262 361/56 |

(Continued)

FOREIGN PATENT DOCUMENTS

JP    2010-050328 A    3/2010

*Primary Examiner* — Dao H Nguyen
(74) *Attorney, Agent, or Firm* — Oliff PLC

(57) ABSTRACT

A semiconductor device used in a protection circuit including a thyristor and an LCR circuit which includes a coil L, a capacitor C and a resistor R, the semiconductor device may include: a semiconductor layer in which the thyristor is provided; an insulating film provided on the semiconductor layer; and a pair of electrodes provided on the insulating film and connected to a protection target circuit, wherein at least one of the coil L, the capacitor C and the resistor R is provided in the insulating film, and the at least one of the coil L, the capacitor C and the resistor R is connected to an anode of the thyristor by a first metal wire filling a first hole provided in the insulating film.

5 Claims, 3 Drawing Sheets

(56) References Cited

U.S. PATENT DOCUMENTS

| | | | |
|---|---|---|---|
| 2004/0065895 A1* | 4/2004 | Lai | H01L 27/0262 257/107 |
| 2004/0201033 A1* | 10/2004 | Russ | H01L 27/0262 257/107 |
| 2007/0170512 A1* | 7/2007 | Gauthier, Jr. | H01L 21/84 257/357 |
| 2008/0012044 A1* | 1/2008 | Salcedo | H01L 27/0262 257/173 |
| 2008/0088993 A1* | 4/2008 | Entringer | H01L 27/0262 361/56 |
| 2010/0044750 A1 | 2/2010 | Imahashi | |
| 2015/0364463 A1* | 12/2015 | Suzuki | H01L 27/0255 257/355 |

\* cited by examiner

SEMICONDUCTOR DEVICE

TECHNICAL FIELD

The disclosure herein relates to a semiconductor device. The disclosure herein especially relates to a semiconductor device that is used in a protection circuit configured to prevent an overvoltage from being applied to an IC circuit and the like.

DESCRIPTION OF RELATED ART

Japanese Patent Application Publication No. 2010-50328 describes a protection circuit configured to protect a protection target circuit from an overvoltage by using a semiconductor device including a thyristor. When an overvoltage, such as a surge, is applied to a power line of the protection target circuit, the semiconductor device turns on to protect the protection target circuit from the overvoltage. Hereinbelow, Japanese Patent Application Publication No. 2010-50328 is referred to as Patent Literature 1.

SUMMARY

In Patent Literature 1, application of overvoltage to the protection target circuit is prevented by the semiconductor device (the thyristor) turning on when a high voltage is applied to the power line. However, when an overvoltage is applied to the power line at a high speed, for example in a few nanoseconds, the overvoltage may be applied to the protection target circuit before the thyristor turns on. If the protection circuit is constituted of the thyristor and an LCR circuit by arranging the LCR circuit between the thyristor and the protection target circuit, application of an overvoltage to the protection target circuit can be prevented during a period of time before the thyristor turns on. However, when the LCR circuit is prepared as a separate component from the thyristor, and the thyristor and the LCR circuit are connected by a wire, an on-operation of the thyristor may be hindered due to occurrence of parasitic capacitance and wire resistance in the wire, and the application of overvoltage to the protection target circuit may not be prevented. The disclosure herein discloses a technique of improving protection performance to protect a protection target circuit in a semiconductor device comprising a thyristor.

A semiconductor device disclosed herein may be used in a protection circuit comprising a thyristor and an LCR circuit which includes a coil L, a capacitor C and a resistor R. The semiconductor device may comprise a semiconductor layer, an insulating film, and a pair of electrodes. In the semiconductor layer, the thyristor may be provided. The insulating film may be provided on the semiconductor layer. The pair of electrodes may be provided on the insulating film and may be connected to a protection target circuit. In the protection circuit, at least one of the coil L, the capacitor C and the resistor R may be provided in the insulating film, and the at least one of the coil L, the capacitor C and the resistor R may be connected to an anode of the thyristor by a first metal wire filling a first hole provided in the insulating film.

In the above-described semiconductor device, at least one of the coil L, the capacitor C, and the resistor R is connected to the anode of the thyristor by the metal wire (the first metal wire) filling the hole provided in the insulating film. That is, the thyristor (the semiconductor layer) and the at least one of the coil L, the capacitor C, and the resistor R are laminated with the insulating film intervened therebetween, and are connected by an embedded wire (the metal wire). Conventionally, when a thyristor and an LCR circuit are connected, they are arranged on a circuit board and are connected by a bonding wire, print wiring, and the like. Therefore, there are limits to shortening a length of the wire and increasing a thickness of the wire. In the above-described semiconductor device, the wire length can be Shortened by adjusting a thickness of the insulating film. Further, the wire thickness can be thickened by enlarging the hole (the first hole) provided in the insulating film. Due to this, parasitic capacitance and wire resistance occurring between the thyristor and the LCR circuit can be reduced.

DETAILED DESCRIPTION

Figure 1:
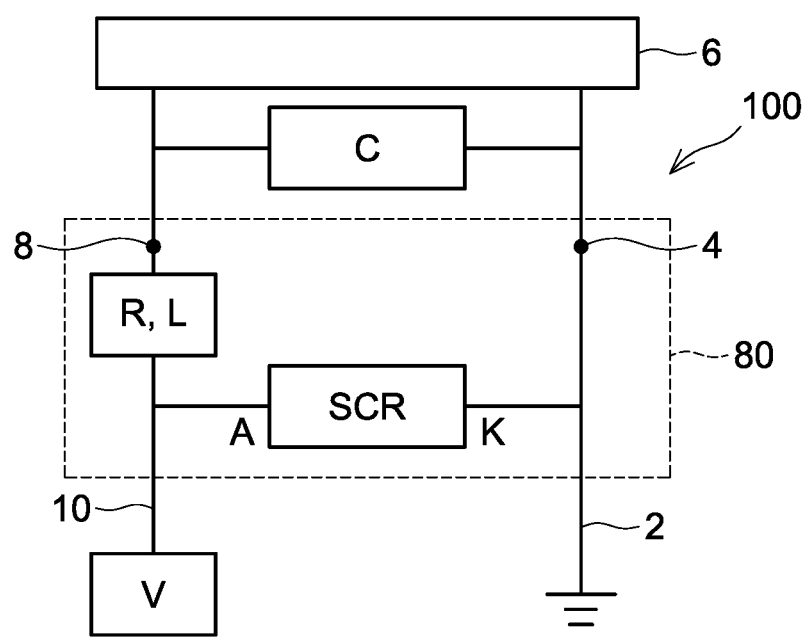
FIG. 1 shows a circuit diagram of a protection circuit using a semiconductor device of a first embodiment.

Some of the features characteristic to the technique disclosed herein will be listed below It should be noted that the respective technical elements are independent of one another, and are useful solely or in combinations.

A semiconductor device disclosed herein may be used as a protection circuit for a protection target circuit, or as a part of the protection circuit. The protection circuit may comprise a thyristor and an LCR circuit including a coil L, a capacitor C and a resistor R. The semiconductor device may comprise the thyristor and at least one of elements (the coil L, the capacitor C and the resistor R) constituting the LCR circuit. The semiconductor device may comprise a semiconductor layer, an insulating film, and a pair of electrodes. In the semiconductor device, the thyristor may be provided. The semiconductor layer may comprise a p-type semiconductor substrate, and an element formation layer provided on the semiconductor substrate. A material of the semiconductor substrate and the element formation layer may be silicon.

The element formation layer may comprise an n-type semiconductor region, a p-type well region provided within the n-type semiconductor region and disposed at a surface of the element formation layer, an $n^+$-type cathode region provided at a part within the p-type well region and disposed at the surface of the element formation layer, and a $p^+$-type anode region provided within the n-type semiconductor region at a position separated from the p-type well region and disposed at the surface of the element formation layer. The $n^+$-type cathode region may be separated from the n-type semiconductor region by the p-type well region. The $p^+$-type anode region may be separated from the p-type well region by the n-type semiconductor region. The thyristor may be constituted of an npn transistor which is constituted of the $n^+$-type cathode region, the p-type well region, and the n-type semiconductor region, and a pnp transistor which is constituted of the $p^+$-type anode region, the n-type semiconductor region, and the p-type well region. In this case, the p-type well region corresponds to a gate region of the thyristor.

The element formation layer may further comprise a $p^+$-type contact region provided within the p-type well region at a position separated from the $n^+$-type cathode region and disposed at the surface of the element formation layer, and an n⁺-type contact region provided within the n-type semiconductor region at a position separated from the p⁺-type anode region and disposed at the surface of the element formation layer. The n⁺-type cathode region and the p⁺-type contact region may be connected to a mutual electrode (cathode electrode). Further, the p⁺-type anode region and the n⁺-type contact region may be connected to a mutual electrode (anode electrode). An ohmic contact between the anode electrode and the n-type semiconductor region can be realized by the n⁺-type contact region. An ohmic contact between the cathode electrode and the p-type well region can be realized by the p⁺-type contact region. The anode electrode and the cathode electrode may be provided on the surface of the element formation layer so as to be separated from each other. The anode electrode may be connected to a power line extending from a power source, The cathode electrode may be connected to a grounding conductor.

For the semiconductor substrate and the element formation layer, boron (B) may be used as p-type impurities, and phosphorus (P) may be used as n-type impurities. An impurity concentration of the semiconductor substrate may be adjusted to between $1\times10^{15}$ to $1\times10^{16}$ cm$^{-3}$, an impurity concentration of the n-type semiconductor region may be adjusted to between $1\times10^{17}$ to $1\times10^{18}$ cm$^{-3}$, an impurity concentration of the p-type well region may be adjusted to between $1\times10^{17}$ to $1\times10^{18}$ cm$^{-3}$, an impurity concentration of the n⁺-type cathode region may be adjusted equal to or more than $1\times10^{19}$ cm$^{-3}$, an impurity concentration of the p⁺-type contact region may be adjusted equal to or more than $5\times10^{18}$ cm$^{-3}$, an impurity concentration of the p⁺-type anode region may be adjusted equal. to or more than $5\times10^{18}$ cm$^{-3}$, and an impurity concentration of the n⁺-type contact region may be adjusted equal to or more than $5\times10^{18}$ cm$^{3}$.

The insulating film may be provided on the semiconductor layer (the element formation layer). As a material of the insulating film, a CVD film constituted of BPSG (Boron Phosphor Silicate Glass), TEOS-SiO₂ (Tetraethoxysilane-based SiO₂), etc. can be used. At least one of the elements (the coil L, the capacitor C and the resistor R) constituting the LCR circuit may be provided in the insulating film. The at least one of the elements provided in the insulating film may be connected to an anode of the thyristor by a metal wire filling a hole provided in the insulating film. That is, the at least one of the elements provided in the insulating film may be connected, by a via wire, to the anode electrode which is connected to the p⁺-type anode region. In the insulating film, two of the elements constituting the LCR circuit may be provided, or all of the elements constituting the LCR circuit may be provided.

The pair of electrodes for connecting to the protection target circuit may be provided on the insulating film One (first electrode) of the pair of electrodes may be connected to the element(s) (the at least one of the coil L, the capacitor C and the resistor R) provided in the insulating film by a metal wire filling a hole provided in the insulating film. That is, the first electrode may be connected to the element(s) provided in the insulating film by a via wire. Further, the other one (second electrode) of the pair of electrodes may be connected to a cathode of the thyristor by a metal wire filling a hole provided in the insulating film. That is, the second electrode may be connected, by a via wire, to the cathode electrode which is connected to the n⁺-type cathode region. For the via wires (the metal wires), polysilicon having a high impurity concentration (e.g., impurity concentration equal to or more than $1\times10^{19}$ cm$^{-3}$), tungsten, aluminum, and the like can be used.

The thyristor may be connected in parallel to the protection target circuit between the power line and the grounding conductor. Further, the element(s) provided in the insulating film which is provided on the semiconductor layer may be connected in parallel to the protection target circuit. The thyristor and the element(s) provided in the insulating film may be connected to the power line at upstream with respect to the protection target circuit. Due to this, when an overvoltage (such as a surge) is applied to the power line, application of the overvoltage to the protection target circuit can be prevented.

EMBODIMENTS

First Embodiment

Figure 2:
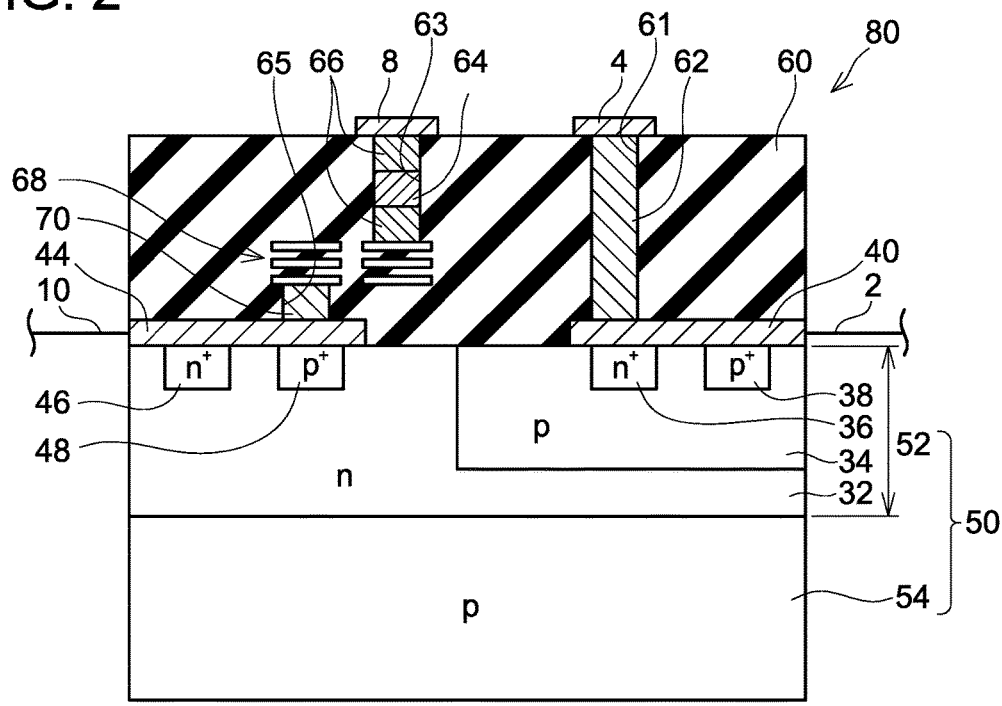
FIG. 2 Shows a cross sectional view of the semiconductor device of the first embodiment.

With reference to FIGS. 1 and 2, a semiconductor device 80 used in a protection circuit 100 will be described. As shown in FIG. 1, the protection circuit 100 is connected in parallel to an IC circuit 6 between a power line 10 and a grounding conductor 2. The IC circuit 6 is an example of a protection target circuit. The protection circuit 100 is connected to the power line 10 at upstream (on a power source V side) with respect to the IC circuit 6. The protection circuit 100 comprises a capacitor C and the semiconductor device 80. The semiconductor device 80 is connected in parallel to the capacitor C between the power line 10 and the grounding conductor 2, and is connected to the power line 10 at upstream with respect to the capacitor C. The semiconductor device 80 comprises a thyristor (SCR), a resistor R, and a coil L.

The semiconductor device 80 comprises a first electrode 8 and a second electrode 4. The first electrode 8 and the second electrode 4 are an example of a pair of electrodes. The first electrode 8 is connected to the IC circuit 6 and the capacitor C by the power line 10. The second electrode 4 is connected to the IC circuit 6 and the capacitor C by the grounding conductor 2. The first electrode 8 and the second electrode 4 are external electrodes of the semiconductor device 80. An anode A of the thyristor is connected to the power line 10, and a cathode K of the thyristor is connected to the grounding conductor 2. Further, the resistor R and the coil L are connected in series to the thyristor. The power line 10 is connected to between the resistor R and the coil L, and the thyristor (the anode A). A current supplied from the power source V passes through the resistor R and the coil L, and is supplied to the IC circuit 6.

As shown in FIG. 2, the semiconductor device 80 comprises a semiconductor layer 50, an insulating film 60 provided on the semiconductor layer 50, and the first electrode 8 and the second electrode 4 provided on the insulating film 60. The semiconductor layer 50 comprises a p-type semiconductor substrate 54, and an element formation layer 52 in which the thyristor is provided. The element formation layer 52 comprises an n-type semiconductor region 32, a p-type well region 34 provided within the n-type semiconductor region 32, an if n⁺-type cathode region 36 provided within the p-type well region 34, a p⁺-type contact region 38 provided within the p-type well region 34, a p⁺-type anode region 48 provided within the n-type semiconductor region 32, and an n⁺-type contact region 46 provided within the n-type semiconductor region 32.

The p-type well region 34 is provided at a part within the n-type semiconductor region 32, and is disposed at a surface of the element formation layer 52. At a portion where the p-type well region 34 is not provided, the n-type semiconductor region 32 is disposed at the surface of the element formation layer 52. The n+-type cathode region 36 is provided at a part within the p-type well region 34, and is disposed at the surface of the element formation layer 52. The n+-type cathode region 36 is separated from the n-type semiconductor region 32 by the p-type well region 34. The n+-type cathode region 36, the p-type well region 34, and the n-type semiconductor region 32 constitute an npn transistor.

The p+-type contact region 38 is provided at a part within the p-type well region 34 at a position separated from the n+-type cathode region 36, and is disposed at the surface of the element formation layer 52. A cathode electrode 40 is provided on the surface of the element formation layer 52 so as to be in contact with the n+-type cathode region 36 and the p+-type contact region 38. The p+-type contact region 38 is a region for realizing ohmic contact between the cathode electrode 40 and the p-type well region 34. The cathode electrode 40 is connected to the grounding conductor 2 (also see FIG. 1).

The p+-type anode region 48 is provided at a part within the n-type semiconductor region 32 at a position separated from the p-type well region 34, and is disposed at the surface of the element formation layer 52. The p+-type anode region 48 is separated from the p-type well region 34 by the n-type semiconductor region 32. The p+-type anode region 48, the n-type semiconductor region 32, and the p-type well region 34 constitute a pnp transistor. The pnp transistor (the regions 48, 32, 34) and the npn transistor (the regions 36, 34, 32) constitute the thyristor.

The n+-type contact region 46 is provided at a part within the n-type semiconductor region 32 at a position separated from the p+-type anode region 48, and is disposed at the surface of the element formation layer 52. An anode electrode 44 is provided on the surface of the element formation layer 52 so as to be in contact with the p+-type anode region 48 and the n+-type contact region 46. The n+-type contact region 46 is a region for realizing ohmic contact between the anode electrode 44 and the n-type semiconductor region 32. The anode electrode 44 is connected to the power line 10 (also see FIG. 1).

The insulating film 60 is provided on the surface of the element formation layer 52 (the semiconductor layer 50). The first electrode 8 and the second electrode 4 are provided on a surface of the insulating film 60 The insulating film 60 covers a part of the element formation layer 52 (a portion of the element formation layer 52 where the electrodes 40, 44 are not provided) and surfaces of the electrodes 40, 44. A first hole 65, a second hole 63, and a third hole 61 are provided in the insulating film 60. Further, a coil 68 is arranged in the insulating film 60. The first hole 65 extends from a middle portion of the insulating film 60 to a rear surface of the insulating film 60. Specifically, the first hole 65 extends between the coil 68 and the anode electrode 44. The second hole 63 extends from the middle portion of the insulating film 60 to the surface of the insulating film 60. The second hole 63 extends between the first electrode 8 and the coil 68. The third hole 61 extends from the surface of the insulating film 60 to the rear surface thereof. The third hole 61 extends between the second electrode 4 and the cathode electrode 40.

The first hole 65 is filled with an embedded wire 70. The embedded wire 70 is an example of a first metal wire, The embedded wire 70 connects the coil 68 and the anode electrode 44. The embedded wire 70 is constituted of polysilicon containing $1\times10^{19}$ cm$^{-3}$ of n-type impurities. Phosphorus is an example of the impurities contained in the embedded wire 70. The coil 68 can be arranged in the insulating film 60 by using publicly known techniques. The coil 68 can be formed in the insulating film 60 by stacking a plurality of insulating sheets that have wiring patterns formed therein, and connecting the respective wiring patterns.

The second hole 63 is filled with an embedded wire 66, The embedded wire 66 is an example of a second metal wire. The embedded wire 66 connects the first electrode 8 and the coil 68. A material of the embedded wire 66 is the same as that of the embedded wire 70. Further, a resistor 64 is provided at a middle portion of the embedded wire 66. The resistor 64 is constituted of polysilicon that contains the impurities at a lower concentration than the embedded wire 66. An impurity concentration of the resistor 64 is adjusted to between $1\times10^{14}$ cm$^{-3}$ to $1\times10^{17}$ cm$^{-3}$. The embedded wire 66 and the resistor 64 are constituted of the same material (polysilicon) having different impurity concentrations. The resistor 64 and the coil 68 are connected between the first electrode 8 and the anode electrode 44 by the embedded wires 66, 70.

The third hole 61 is filled with an embedded wire 62. The embedded wire 62 is an example of a third metal wire. The embedded wire 62 connects the second electrode 4 and the cathode electrode 40. A material of the embedded wire 62 is the same as those of the embedded wires 66, 70.

Advantages of the semiconductor device 80 will be described. In the protection circuit 100 comprising the semiconductor device 80, a current supplied from the power source V is supplied to the IC circuit 6 through the anode electrode 44, the coil 68, the resistor 64, and the first electrode 8. Due to this, when an overvoltage is applied to the power line 10, application of the overvoltage to the IC circuit 6 before the thyristor turns on can be prevented. Further, in the semiconductor device 80, the coil 68 and the resistor 64 are arranged above the thyristor, and the coil 68 and the resistor 64 are connected to the thyristor by the embedded wires 66, 70 filling the holes 63, 65. Thicknesses (cross sectional areas) of the embedded wires 66, 70 are adjustable according to sizes of the holes 63, 65. That is, the thicknesses of the embedded wires 66, 70 can be easily enlarged. Further, since the thyristor, and the coil 68 and the resistor 64 are connected by the embedded wires 66, 70, lengths of the wires can he shortened. By using the semiconductor device 80, a smaller wire resistance is achieved as compared to a conventional case in which a coil and a resistor are connected to a thyristor by a bonding wire, print wiring, and the like, and parasitic capacitance can thereby be suppressed from occurring.

Conventionally, in a plan view of a circuit board, a coil and a resistor are arranged at positions different from a position at which a thyristor on the circuit board is provided. In the semiconductor device 80, in a plan view of a circuit board, the coil and the resistor arc arranged at a same position where the thyristor on the circuit board is provided. Therefore, an area of the circuit board can be made small. That is, by using the semiconductor device 80, a compact circuit board can be realized. It should be noted that a size of the third hole 61 is also adjustable, and the cathode electrode 40 and the second electrode 4 can be connected by the wire 62 with a small resistance.

Figure 3:
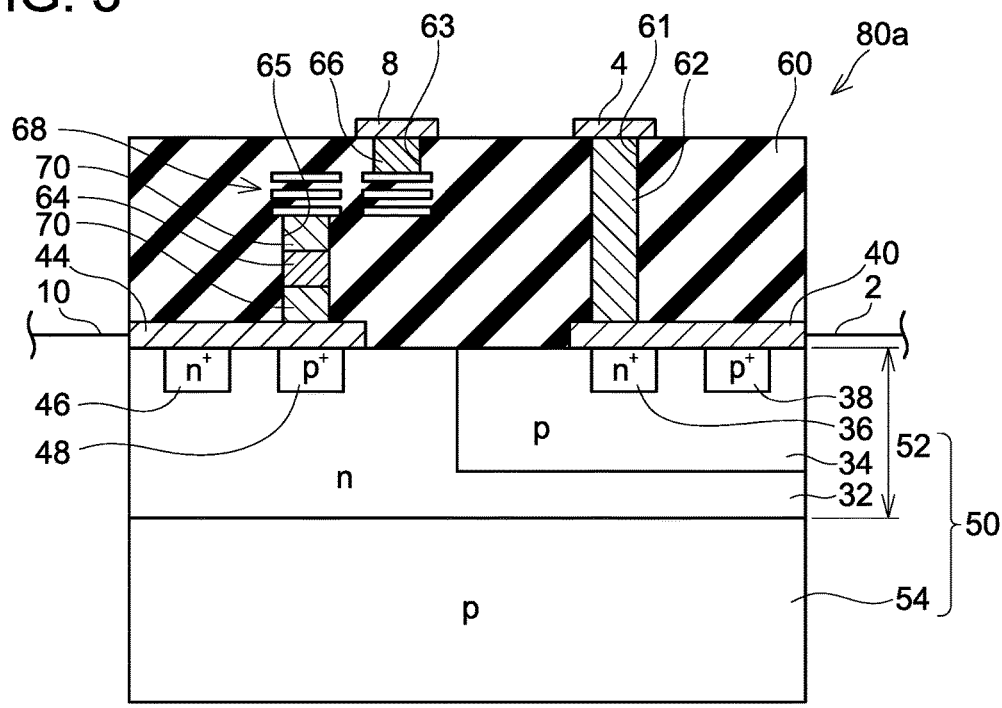
FIG. 3 shows a variant of the semiconductor device of the first embodiment.

Further, as in a semiconductor device 80a shown in FIG. 3, the resistor 64 may be provided at a middle portion of the embedded wire 70 in the first hole 65. In this case, only the embedded wire 66 may be provided in the second hole 63. The resistor 64 and the coil 68 can be arranged in this order from the anode electrode 44 toward the first electrode 8.

In the above-described semiconductor device 80, the resistor 64 is provided in the embedded wire 66 by employing a lower impurity concentration for the middle portion of the embedded wire 66. However, the second hole 63 may be filled with an embedded wire having an even impurity concentration, in this case, the impurity concentration of the embedded wire filling the second hole 63 is made lower than that of the embedded wire 62 filling the third hole 61. That is, the second hole 63 is tilled with a resistor. Similarly, in the semiconductor device 80a, the first hole 65 may be filled with an embedded wire having a lower impurity concentration than the embedded wire 62. Further, a commercially available coil and resistor may be arranged in the insulating film, and they may be connected by embedded wires.

Second Embodiment

Figure 4:
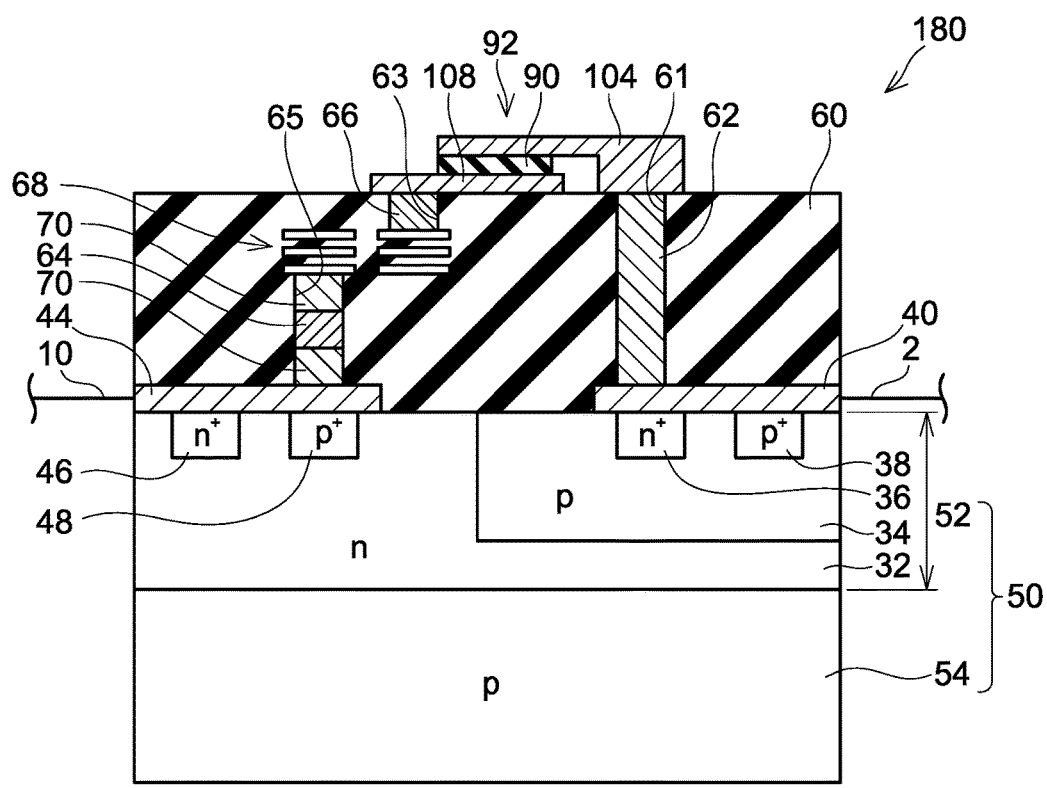
FIG. 4 shows a cross sectional view of a semiconductor device of a second embodiment.

With reference to FIG. 4, a semiconductor device 180 will be described. The semiconductor device 180 is a variant of the semiconductor device 80a, and comprises the thyristor (SCR), the capacitor C, the resistor R, and the coil L (also see FIG. 1). Configurations of the semiconductor device 180 which are identical to those of the semiconductor device 80a will be denoted with the same reference signs as in the semiconductor device 80a, and description thereof may be omitted.

In the semiconductor device 180, a first electrode 108 is connected to the embedded wire 66, and a second electrode 104 is connected to the embedded wire 62. Further, an insulating film 90 is provided between the first electrode 108 and the second electrode 104 at an outside of the insulating film 60. A thickness of the insulating film 90 is approximately 1 µm. A capacitor 92 is constituted of the first electrode 108, the insulating film 90, and the second electrode 104. In the semiconductor device 180, it can be said that the capacitor 92 is provided at the outside of the insulating film 60. It should be noted that the technique of constituting a capacitor by providing an insulating film between a first electrode and a second electrode can be applied also in the semiconductor device 80 (see FIG. 2).

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device used in a protection circuit comprising a thyristor and an LCR circuit which includes a coil L, a capacitor C and a resistor R, the semiconductor device comprising:
   a semiconductor layer in which the thyristor is provided;
   an insulating film provided on the semiconductor layer; and
   a pair of electrodes provided on the insulating film and connected to a protection target circuit;
   wherein
   at least one of the coil L, the capacitor C and the resistor R is provided in the insulating film, and the at least one of the coil L, the capacitor C and the resistor R is connected to an anode of the thyristor by a first metal wire filling a first hole provided in the insulating film.

2. The semiconductor device according to claim 1, wherein
   one of the pair of electrodes is connected to the at least one of the coil L, the capacitor C and the resistor R by a second metal wire filling a second hole provided in the insulating film.

3. The semiconductor device according to claim 2, wherein
   other one of the pair of electrodes is connected to a cathode of the thyristor by a third metal wire filling a third hole provided in the insulating film.

4. The semiconductor device according to claim 3, wherein
   all of the coil L, the capacitor C and the resistor R are provided in the insulating film.

5. The semiconductor device according to claim 1, wherein
   all of the coil L, the capacitor C and the resistor R are provided in the insulating film.

* * * * *